United States Patent [19]

Miller

[11] Patent Number: 4,904,931
[45] Date of Patent: Feb. 27, 1990

[54] ELECTRO-OPTICAL VOLTAGE MEASURING SYSTEM INCORPORATING A METHOD AND APPARATUS TO DERIVE THE MEASURED VOLTAGE WAVEFORM FROM TWO PHASE SHIFTED ELECTRICAL SIGNALS

[75] Inventor: Robert C. Miller, New Alexandria, Pa.

[73] Assignee: Westinghouse Electric Corp., Pittsburgh, Pa.

[21] Appl. No.: 250,289

[22] Filed: Sep. 28, 1988

[51] Int. Cl.[4] .................... G01R 31/00; G01R 31/02
[52] U.S. Cl. .................................. 324/96; 356/365; 364/577
[58] Field of Search ............... 324/96, 97; 356/364, 356/365; 364/577; 328/14

[56] References Cited

U.S. PATENT DOCUMENTS 3,769,584 10/1973 Iten et al. .......................... 324/96
4,629,323 12/1986 Matsumoto ...................... 324/96
4,698,497 10/1987 Miller et al. .

OTHER PUBLICATIONS

A. Yariv, Introduction to Optical Electronics, 2nd Edition, copyright 1977, pp. 253-259, Holt, Rinehart and Winston.
Day et al., Optical Power Line Voltage and Current Measurement Systems, vol. 1, Research Project 2748, National Bureau of Standards, Boulder, Colo.

*Primary Examiner*—Ernest F. Karlsen
*Assistant Examiner*—W. Burns
*Attorney, Agent, or Firm*—B. R. Studebaker

[57] ABSTRACT

The voltage between two objects is measured utilizing an electro-optic crystal exhibiting birefringence in two axes (slow and fast) mutually orthogonal to an optic axis extending between the two objects. Two collimated light beams polarized at an angle to the slow and fast axes is passed through the crystal parallel to the optic axis with one of the collimated light beams retarded relative to the other by about ¼ wave. The two beams emerging from the crystal are passed through a polarizer and converted to phase shifted electrical signals by photo diodes in electric circuits which regulate the sources of the light beams to maintain the peak magnitudes of the two electric signals constant and equal. As another feature of the invention, a stairstep output waveform representative of the measured waveform is generated in a digital computer from a bidirectional cumulative count of zero crossings of the two electric signals which is incremented or decremented depending upon which of the two electrical signals is leading. Improved accuracy of the output signal is achieved by adjusting the stairstep waveform by the magnitude of the smaller of the two electrical signals, with the sense of the adjustment determined by the relative polarities of the two electrical signals.

18 Claims, 6 Drawing Sheets

ELECTRO-OPTICAL VOLTAGE MEASURING SYSTEM INCORPORATING A METHOD AND APPARATUS TO DERIVE THE MEASURED VOLTAGE WAVEFORM FROM TWO PHASE SHIFTED ELECTRICAL SIGNALS

BACKGROUND OF INVENTION

1. Field of Invention

This invention relates to an electro-optical system for accurately determining the electrical voltage between two spaced objects. More specifically, the invention relates to a system which utilizes an electro-optical crystal with a fourfold axis of rotary inversion which exhibits birefringence in proportion to the magnitude of an applied electric field. In particular, it relates to generating two electrical signals in quadrature from parallel beams of collimated polarized light which are passed through the electro-optical crystal and retarded by fractional waveplates to produce a relative retardation of ¼ wave. Finally, the invention relates to deriving a representation of the voltage waveform generating the field applied to the electro-optic crystal from the two electrical signals in quadrature utilizing a digital computer.

BACKGROUND INFORMATION

Electro-optical systems for measuring electric voltages are known. For instance, devices known as Pockel cells utilize certain crystals which exhibit birefringence, that is a difference in the index of refraction in two orthogonal planes, in the presence of an electric field. Some of these crystals, such as, for example, KDP (potassium dihydrogen phosphate), have a fourfold axis of rotary inversion. Such materials have the property that in the absence of an electric field the index of refraction for light propagating along the fourfold axis is independent of the plane of polarization of the light. However, if an electric field is applied parallel to the direction of the light, the index of refraction for light polarized in one direction transverse to the fourfold axis, known as the fast axis increases and that in an orthogonal direction, also transverse to the fourfold axis, and known as the slow axis, decreases by an amount which is proportional to the strength of the electric field. In such Pockel cell devices, if light is polarized in a plane which forms an angle to these transverse axis, the component of the polarized light in the direction of the slow axis with the decreased index of refraction is retarded with respect to the other component. If the crystal is aligned with its fourfold axis extending between the objects between which the voltage is to be measure, and the polarized light is directed parallel to the fourfold axis, the total retardation will be proportional to the total voltage differential between the two objects. This retardation is typically measured in wavelengths. The retardation is detected in an analyzer and converted to an electrical signal for producing an output representative of the magnitude of the voltage generating the field. Due to the cylic nature of this electrical signal, the output is only unambiguous for voltages producing a retardation which is less than the half wave voltage for the crystal. In KDP, this half wave voltage is about 11300 volts. This type of device is therefore not suitable for measuring transmission line voltages which can be 100,000 volts rms and more.

Other types of crystals used in Pockel cells respond to an electric field in a direction perpendicular to the direction of propagation of light through the cell. Such cells only provide an indication of the potential at the intersection of the beam with the field. Thus, a single cell cannot integrate the potential over the full space between two objects, and therefore these devices do not provide an accurate measurement of the voltage between the two objects. Systems using this type of Pockel cell commonly either, (1) measure the potential at one point and assume that the potential at all other points between the two objects can be derived from this single measurement, or (2) provide some sort of voltage divider and apply a fixed fraction of the line voltage to the cell in an arrangement which maintains the field within the cell constant. The problem with the first approach is that except for low impedance paths, the field along a path is sensitive to the location of any conducting or dielectric bodies in the vicinity of the path. Thus, if this type of Pockel cell is mounted on the surface of a conductor and the field measured, the reading would depend on the size and shape of the conductor, on the distance from the conductor to ground, on the location and potential of any nearby conductors, on the location of any insulating or conducting bodies near the sensor or on the ground beneath the sensor, and on the presence of any birds, rain droplets or snow between the sensor and ground. Thus, only under very ideal circumstances would accurate measurements be possible with such a system. The problem with the second approach is in providing an accurate stable voltage divider.

Optical voltage measuring systems are desirable because they provide good isolation from the voltage being measured. Through the use of optic fiber cables, it is possible to easily and conveniently provide remote indicators which are not subject to the electrical disturbances which remote indicators fed by electrical signals must contend with.

There remains, however, a need for an optical system for accurately measuring very large voltages such as, for example, those present in electrical transmission systems without the use of a voltage divider.

Subordinate to this need is a need for such an optical system which can integrate the field over the entire space between the objects, such as in the case of the electrical transmission system between line and ground.

SUMMARY OF THE INVENTION

These and other needs are satisfied by the invention which is directed to a method and apparatus for measuring an electrical potential between two spaced apart objects utilizing a crystal having a fourfold axis of rotary inversion extending between the spaced apart objects. Collimated light polarized with a plane of polarization forming an acute angle to the fast and slow axes of the crystal by first polarizing means is directed through the crystal parallel to the fourfold axis of rotary inversion. Retardation, due to the electric field, of the polarized collimated light passed through the crystal, is detected by additional polarizing means. The light emerging form the additional polarizing means is converted to electrical signals by photodetectors. To eliminate ambiguities in the measurement of voltages which exceed the half-wave voltage of the crystal, a first portion of the polarized collimated light is retarded with respect to a second portion. Preferably, this retardation is ¼ wave so that the two electrical signals generated from the two portions of polarized collimated light are in quadrature.

Preferably, the collimated light is generated by two separate light sources. The parallel collimated light beams produced by these two sources are polarized by the first polarized means and pass through the electro-optic crystal to form the first and second portions of the polarized collimated light which are converted into the two electrical signals. The intensities of these light sources for the two beams are regulated by feedback circuits to maintain the peak to peak values of the two electrical signals constant and equal.

One feature of the invention is a method and apparatus for deriving a waveform representative of an original waveform, such as the voltage generating the field applied to the crystal in the voltage measuring system, from two phase shifted electrical signals such as the two constant peak amplitude electrical signals generated by the photodetectors in the voltage measuring system. In one sense, the original waveform is reconstructed from selected segments of the two electrical signals with the segments selected in part as a function of the sequence of zero crossings of the two electrical signals. At another level, the representative waveform can be constructed as a stairstep signal having discrete incremental values which increment or decrement with each zero crossing depending upon which of the two electrical signals is leading. Reversal of direction of the measured waveform can be detected, for instance, from two zero crossings in succession by one of the two electrical signals.

While such a stairstep waveform may be adequate for many applications, the accuracy of such a signal does not reach the 0.1% desired in the measurement of transmission line voltages which, for example, can be 260,000 volts peak to peak or 93,000 volts rms. Accordingly, the invention includes interpolating between steps of the stairstep waveform using the instantaneous value of a selected one of the two electrical signals. The value of the electrical signal which is smaller in magnitude is always selected for the interpolation. This results in utilization of portions of the component waveforms where the small angle approximation, that is where the sine of the angle is approximately equal to the angle, is valid, and hence the errors introduced by the interpolation are small.

In order to eliminate erratic indexing of the zero crossing count for random behavior of the electrical signals around zero, a dead band is centered on the zero axis of the electrical signals. When the value of the smaller electrical signal enters this dead band, indexing of the zero crossing count is suspended until the signal emerges from the band. If it exits on the opposite side of the band from which it entered, the zero crossing count is indexed. Whether it is incremented or decremented depends upon the direction in which the original waveform is moving, which is manifested by which of the quadrature electrical signals is leading. If the electrical signal of smaller magnitude exits on the same side of the dead band as it entered, the measured waveform has changed direction and the zero crossing count is not indexed. Preferably, the magnitude of the electrical signal required to exit the dead band is greater than that required to enter. This hystereses in the width of the dead band prevents erratic behavior at the boundaries.

While this reconstruction of a waveform from phase shifted electrical signals is particularly suitable for use in the opto-electrical system, which is also part of the invention, for generating waveforms representative of sinusoidal voltage waveforms of large magnitude, it also has applicability to reconstructing other types of waveforms in other applications.

BRIEF DESCRIPTION OF THE DRAWINGS

A full understanding of the invention can be gained from the following description of the preferred embodiment when read in conjunction with the accompanying drawings in which:

FIGS. 3a, b and c are waveform diagrams illustrating respectively the line to ground voltage to be measured, the waveforms of the phase shifted electrical signals generated by the opto-electrical measurement system of FIG. 2, and the output waveform reconstructed from the phase shifted electrical waveforms.

DESCRIPTION OF THE PREFERRED EMBODIMENTS

As is known, the voltage between two spaced points a and b is defined by the equation:

$$Vab = \int_a^b E(x)\,dx \quad \text{(Eq. 1)}$$

where $E(x)$ is the field gradient at x and the integral is independent of path. Thus, in order to accurately measure the voltage between spaced points a and b, it is necessary that a sensor physically extend from a to b, interact with the field at every point along its length, and change some property so that some parameter varies in an additive fashion allowing the integral to be evaluated. In the measurement of transmission line voltages, this requires that one end of a sensor be electrically connected to the transmission line and the other end be electrically connected to ground. Thus, the sensor must be of sufficient length to withstand normal line voltages and any surges which might be encountered.

The present invention utilizes an electro-optic crystal to measure the integral of the field gradient from point a to b and thus provides a true value, for the voltage between a and b. As mentioned previously, certain crystaline materials having a fourfold axis of rotary inversion, such as KDP (potassium dihydrogen phosphate), have the property that in the absence of an electrical field, the index of refraction for light propagating along the fourfold axis is independent of the direction of polarization of the light. However, if an electric field is applied parallel to the direction of propagation of the light, the index of refraction for light polarized in a given direction perpendicular to the fourfold axis increases while the index of refraction of light polarized in a perpendicular direction decreases by an amount which is proportional to the field. In KDP, the direction parallel to the fourfold axis, which is also called the optic axis, is commonly designated as the Z direction, and the orientations of the polarization for which the maximum changes in refractive index with electric field are observed are commonly designated as the X' and Y' directions.

Figure 1:
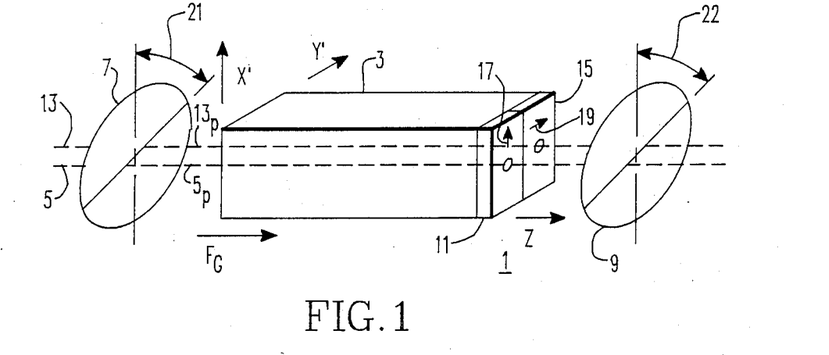
FIG. 1 is a schematic diagram illustrating the principle of operation of voltage measuring systems which form a part of the invention.

To understand the principle of operation of such an opto-electrical sensor, reference is made to FIG. 1. In the conventional Pockel cell device 1, a KDP crystal 3 is aligned with its fourfold axis of rotary inversion, Z, parallel to the field gradient, $F_g$ to be measured. A single beam of unpolarized light is incident on a first linear polarizer 7. The crystal 3 and first polarizer 7 are arranged such that collimated polarized light, $5_p$ exiting the polarizer is propagating parallel to the Z axis of the crystal and the plane of polarization of the light is at an angle of 45 degrees to the X' and Y' axes of the crystal.

The incident polarized beam $5_p$ can be decomposed into two components of equal intensity, one polarized parallel to the X' axis and the other polarized parallel to the Y' axis. In the absence of an electric field, these two components will propagate with equal velocities and exit the crystal 3 in phase with one another. When an electric field is applied along the Z axis of the crystal, the refractive indexes, and, as a result, the velocities of the two components will not be equal, and there will be a phase shift or a retardation between the two components when they exit the crystal. Since the retardation in any small element along the crystal is proportional to the electric field acting on that element multiplied by the length of the element, and the total retardation is equal to the sum of the retardations in all of the elements along the crystal, retardation of the components exiting the crystal is proportional to $\int Edl$, and thus the difference in voltage between the two ends of the crystal.

The retardation is usually expressed in wavelengths, that is a retardation of one means the optical path in the crystal is one wavelength longer for one of the components of the beam $5_p$ than for the other, and is given by the equation:

$$\Gamma = \frac{r_{63} n^3}{\lambda} \times V \quad \text{(Eq. 2)}$$

where $r_{63}$ is an electro-optic coefficient, $n_z$, is the refractive index for light propagating along the Z axis, $\lambda$ is the wavelength of the light in vacuum, and V is the difference in voltage in the two ends of the of the crystal. While these parameters are known and the retardation can be calculated, it is usually more convenient to combine them in a single parameter, the half-wave voltage, $V_h$, defined by the equation:

$$V_h = \frac{\lambda}{2 \, r_{63} \, n^3} \quad \text{(Eq. 3)}$$

and thus:

$$\Gamma = \frac{V}{2V_h} \quad \text{(Eq. 4)}$$

$V_h$ is usually determined as part of the calibration of the sensor. If the two components of the beam $5_p$ exiting the crystal are passed through a second polarizer 9 oriented parallel to the first, the intensity of the beam I exiting the polarizer 9 is related to the retardation by equation:

$$I = I_O \cos^2(\pi\Gamma) \quad \text{(Eq. 5)}$$

where $I_O$ is the intensity of the exiting beam with zero retardation: That is, with no voltage difference between the ends of the crystal. If the second polarizer 9 is rotated 90 degrees, then I is given by equation 5 in which the square of the sine function is substituted for the square of the cosine function.

It is common in such Pockel cell devices described to this point to insert a fractional wave plate 11 between the crystal and the second polarizer 9 to shift the retardation to a linear point on the sine or cosine squared function.

Because of the periodic properties of the sine and cosine functions, a device as discussed to this point would only provide unambiguous results for voltages less than $V_h$. For KDP, at a wavelength of 800 nm, $V_h$ is roughly 11,300 volts, and thus such a device cannot be used to measure transmission line voltages which are typically around 100,000 volts rms line to ground or more.

In order to resolve the ambiguities inherent in the conventional Pockel cell arrangement, and allow measurements at transmission line voltages, the present invention utilizes a second light beam 13 parallel to the beam 5. The second light beam 13 is polarized by the first polarizer 7 to form a second polarized light beam $13_p$ which is passed through the crystal 3 parallel to the Z axis. This second polarized light beam $13_p$ can also be resolved into two components, one parallel to the Z axis and the other parallel to the Y axis. The second beam exiting the crystal 3 is also passed through the second polarizer 9 so that the intensity of the second beam exiting polarizer 9 is also related to the retardation by equation 5 if the second polarizer is oriented parallel to the first polarizer 7 or by the sine squared function if the second polarizer is orthogonal to the first polarizer. The second light beam 13 exiting the crystal 3 is also retarded by a fractional wave plate 15 before passing through the second polarizer 9. The fractional wave plates 11 and 15 are selected so that one beam is retarded with respect to the other. In the preferred form of the invention, the one beam is retarded ¼ wave with respect to the other so that the beams exiting the second polarizer are in quadrature. This retardation may be accomplished by utilizing one-eighth wave plates for the fractional wave plates 11 and 13 with their axes 17 and 19 respectively oriented 90 degrees with respect to one another. Other arrangements can be used to retard the one light beam ¼ wave with respect to the other. For instance, one beam could be passed through a quarter wave plate while the other passes directly from the crystal to the second polarizer. Retarding one beam exactly ¼ wave with respect to the other simplifies the calculation required, but as long as the retardation is about ¼ wave, meaning within about plus or minus 20% of ¼ wave, satisfactory results can be achieved. In addition to ¼ wave retardation, odd multiples of ¼ wave can also be used i.e., ¾, 5/4 et cetera.

Figure 2:
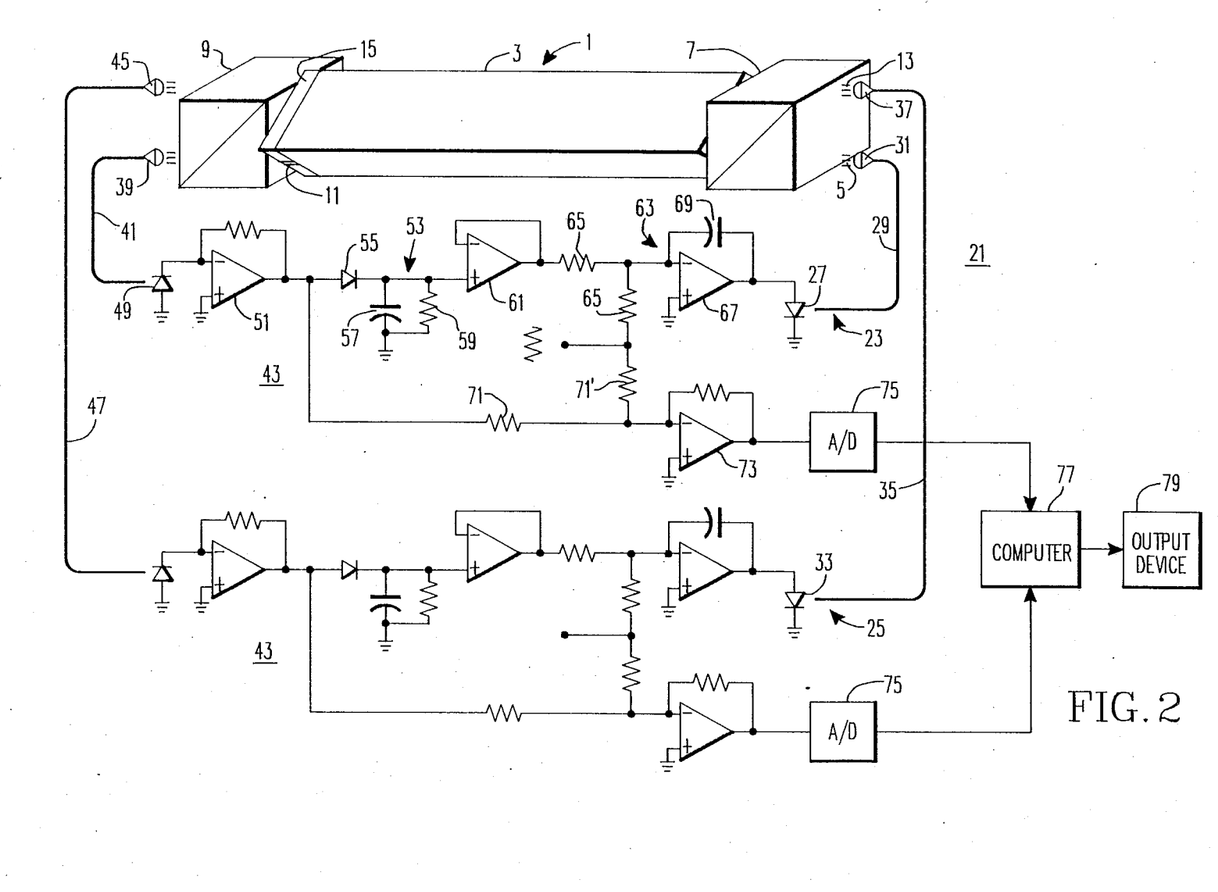
FIG. 2 is a schematic diagram of a voltage measuring system in accordance with the invention.

With the two one-eighth wave plates oriented as indicated in FIG. 2, the intensities of the two beams exiting the second polarizer can be determined as follows:

$$I_1 = I_0 \cos^2(\pi\Gamma + \pi/8) \quad \text{(Eq. 6)}$$

and $$I_2 = I_0 \cos^2(\pi\Gamma - \pi/8) \quad \text{(Eq. 7)}$$

These two signals are in quadrature and, with the exception of a constant, allow the unambiguous determination of the voltage applied to the crystal.

FIG. 2 illustrates schematically a complete voltage measuring system in accordance with the invention. This system 21 includes the sensor 1 comprising the crystal 3, the first and second polarizers 7 and 9 respectively, and the one-eighth wave plates 11 and 15. The system 21 also includes first and second light sources 23 and 25 which generate the two collimated light beams 5 and 13 respectively. The light source 23 includes a light emitting diode (LED) 27. Light produced by the LED 27 is transmitted by optic fiber cable 29 and passed through collimating lens 31 to produce the first collimated light beam 5. Similarly the LED 33 in second light source 25 produces light which is transmitted by the optic fiber cable 35 and passed through collimating lens 37 to produce the second collimated light beam 13. Light from the first beam 5 exiting the second polarizer 9 is gathered by lens 39 and conducted through fiber optic cable 41 to a first electronic circuit 43. Similarly, the second beam exiting the second polarizer 9 is focused by lens 45 on fiber optic cable 47 which directs the light to a second electronic circuit 43.

The electronic circuits 43 are identical and include a photo diode 49 which converts the light beam carried by the optic fiber cables 41 or 47 respectively into an electrical current. The electronic circuits 43 include a transimpedance amplifier 51 which provides a low impedance input to a peak detector 53. Peak detector 53 includes a diode 55 which feeds a capacitor 57 shunted by leak resistor 59. The peak detector also includes a buffer amplifier 61 to prevent the peak detector from being loaded by the following stage. The following stage 63 acts as a summing amplifier, integrator, and a driver for the respective LED 27 or 33. It includes a pair of resistors 65, and an operational amplifier 67 shunted by an integrating capacitor 69. An output circuit includes a pair of resistors 71 and 71' (equal to twice 71 in value), and an output amplifier 73. A reference voltage $-e_r$ is applied to the summing circuits formed by the resistors 65 and 71-71'.

The electronic circuits 43 operate as follows: Light exiting the second polarizer 9 and transmitted via the optic fiber cable 41 or 47 respectively is converted to an electrical current signal by the photo diode 49. The peak detector 53 generates a signal which represents the peak value of this electrical current. The peak value signal is compared with the reference signal through the resistors 65 connected to the inverting input of the operational amplifier 67. Since the diode 55 assures that the peak signal is positive, and since the reference signal $-e_r$ is negative, these two signals are compared and the error between the two is applied to the integrator formed by the operational amplifier 67 and the capacitor 69. This integrated error signal is used to drive the LED 27 or 33 respectively of the light sources for the first and second light beams. Thus, the circuits 43 are feedback circuits which regulate the intensity of the respective light beam so that the peak values of the current signals generated by these light beams through the photo detectors 49 remain constant and equal to the reference voltage and, hence, equal to each other. The summing amplifier 73 and voltage dividing resistors 71 subtract the reference voltage from the unidirectional currents produced by the photodetectors 49 to produce bipolar voltage output signals $e_1$ and $e_2$ respectively in response to the field applied to the crystal 3. The analog signals $e_1$ and $e_2$ are periodically sampled by an analog to digital converter 75 for input into a digital computer 77. The digital computer 77 reconstructs the voltage waveform from the two signals $e_1$ and $e_2$ for presentation on an output device 79. The output device 79 can be, for instance, a digital readout, and/or can be a recorder which generates a permanent log of the measured voltage waveform.

Figure 3:
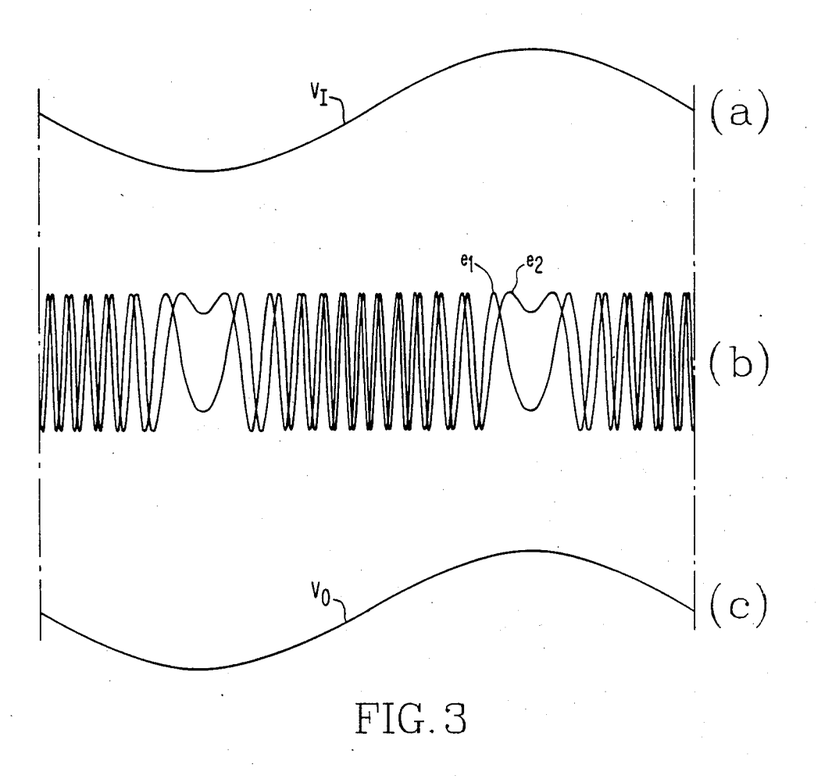

Waveforms a, b and c of FIG. 3 illustrate on a comparative time basis the voltage waveform $V_I$ to be measured, the quadrature electrical signals $e_1$ and $e_2$ generated in response to the voltage waveform a by the system of FIG. 2, and the output waveform $V_O$ generated by the system of FIG. 2 which is representative of the voltage waveform a.

Figure 4:
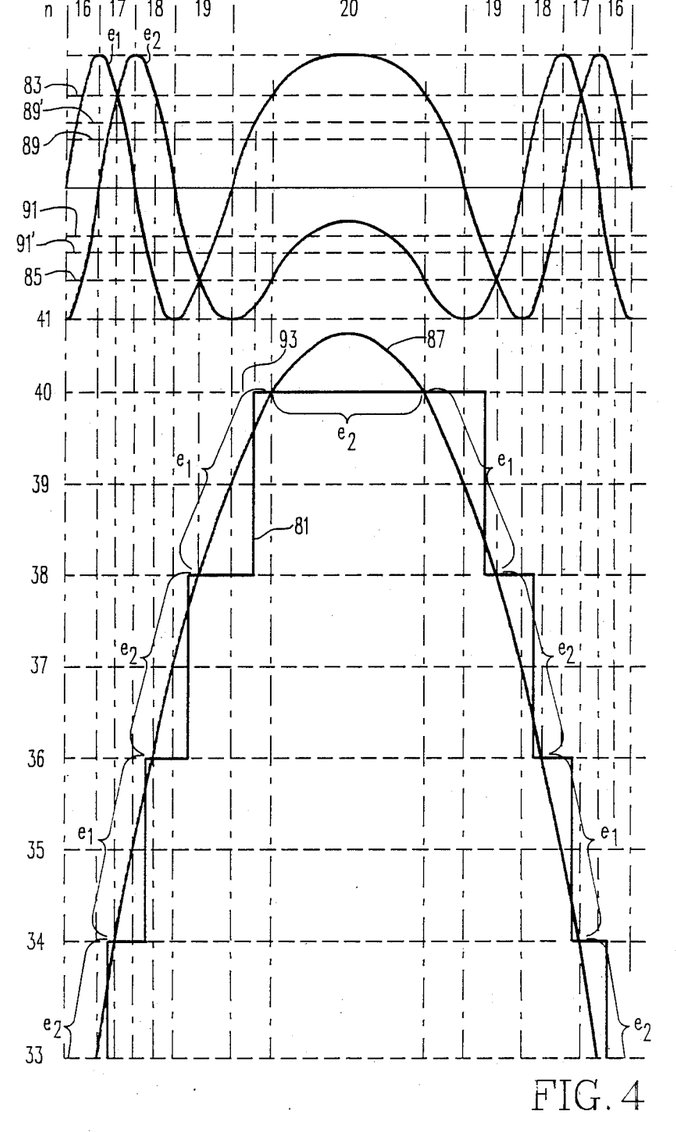
FIG. 4 is a diagram illustrating how the output waveform is reconstructed from the phase shifted electrical waveforms.

FIG. 4 illustrates the manner in which the waveform c in FIG. 3 is constructed from the quadrature electrical signals $e_1$ and $e_2$ forming the waveform b in FIG. 3. Essentially the method comprises maintaining a bidirectional count of the number of zero crossings of the two electrical signals $e_1$ and $e_2$. In the example given in FIG. 4, the count, n of such zero crossings is shown across the top of the figure. The count n is incremented as the voltage waveform represented by $e_1$ and $e_2$ is becoming more positive (or less negative) and is decremented as the magnitude of the incremented waveform is becoming more negative (or less positive). The direction in which the waveform is moving is determined by which of the quadrature signals is leading. Reversal of the direction of the voltage waveform results in a switch in which signal $e_1$ or $e_2$ is leading and can be detected by two successive zero crossings by the same signal $e_1$ or $e_2$.

A stairstep approximation of the voltage waveform indicated by the trace 81 in FIG. 4 can be generated from the cumulative count n of the zero crossings. In the particular sample shown, the output stairstep waveform is generated as a function of twice the accumulated count n as shown by the scale on the left side of the trace 81 in FIG. 4.

This stairstep approximation 81 of the original voltage waveform generating the field applied to the opto-electrical sensor can be adequate for many purposes. However, where more accurate reproduction of the original voltage wave-form is required, such as in monitoring the voltage of high power transmission lines where an accuracy of 0.1 percent is required, interpolation must be made between the stairstep values of the output signals generated by the accumulated zero crossing count n. This smoothing of the output waveform is achieved by adding or subtracting the instantaneous value of a selected one of the quadrature signals $e_1$ and $e_2$ to the stairstep value. The selected signal is the one of the two signals, $e_1$ and $e_2$, which is smaller in magnitude at the given instant. Thus, the magnitude of the signal $e_1$ or $e_2$ which is between the traces 83 and 85 in FIG. 4 is selected. This results in utilization of portions of the waveforms $e_1$ and $e_2$, where the small angle approximation, that is, where the sine of the angle is approximately equal to the angle, is valid. As can be seen in FIG. 4, the technique essentially results in the stringing together of the segments of the quadrature signals $e_1$ and $e_2$ to reconstruct the original voltage waveform.

In order to avoid random indexing of the bidirectional cumulative count n of zero crossings which could occur with small signals, a band is created around the zero axis as indicated by the lines 89 and 91 in FIG. 4. Zero crossings are not counted while a signal $e_1$ or $e_2$ is in this dead band. Instead, a determination is made when the signal again leaves the dead band as to whether the zero crossing n should be indexed. If the quadrature signal exits the dead band on the same side that it entered, then the target signal has changed direction and n should not be indexed. If the quadrature signal exits the dead band on the opposite side from which it entered, then there has been a zero crossing and n is indexed. While a quadrature signal is within the dead band, its magnitude is continued to be used to interpolate between the stairsteps. If the quadrature signal crosses the zero axis, the sign of the increment which is added or subtracted to the stairstep is changed to reflect the transition. This delay in the indexing of the zero crossing count n until the quadrature signal leaves the dead band results in a slight shift in time of the stairstep signal, as indicated at 93 in FIG. 4. The width of the dead band should be set as wide as possible without having the instantaneous values of both $e_1$ and $e_2$ fall within the band at anytime. Preferably, the boundaries of the dead band are expanded to 89'-91' once a signal is within the band. This introduces hysteresis into the dead band which aids in assuring a positive transition into and out of the dead band.

Figure 5A:
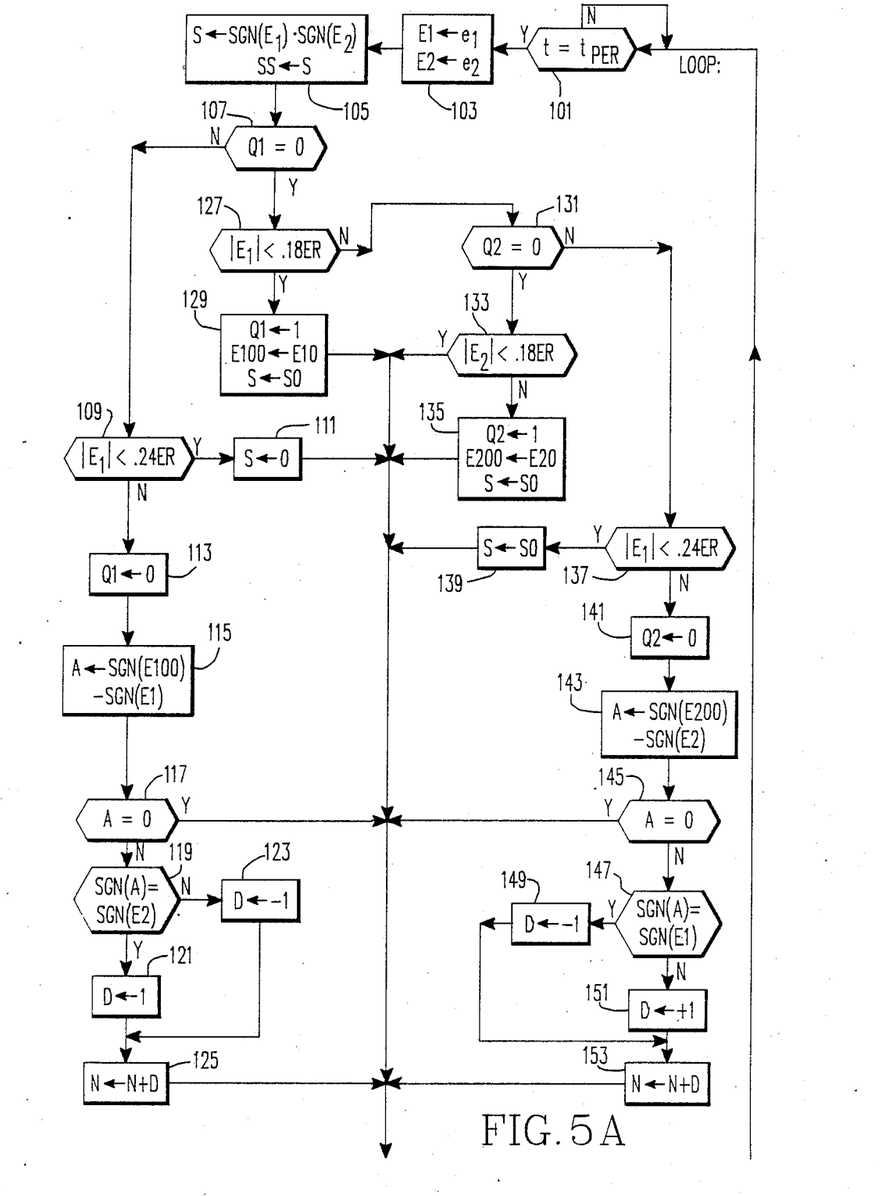
FIGS. 5A and 5B are flow charts illustrating the program used by the system of FIG. 2 to construct the output waveform from the phase shifted electrical waveforms in the manner illustrated in FIG. 4.
Figure 5B:
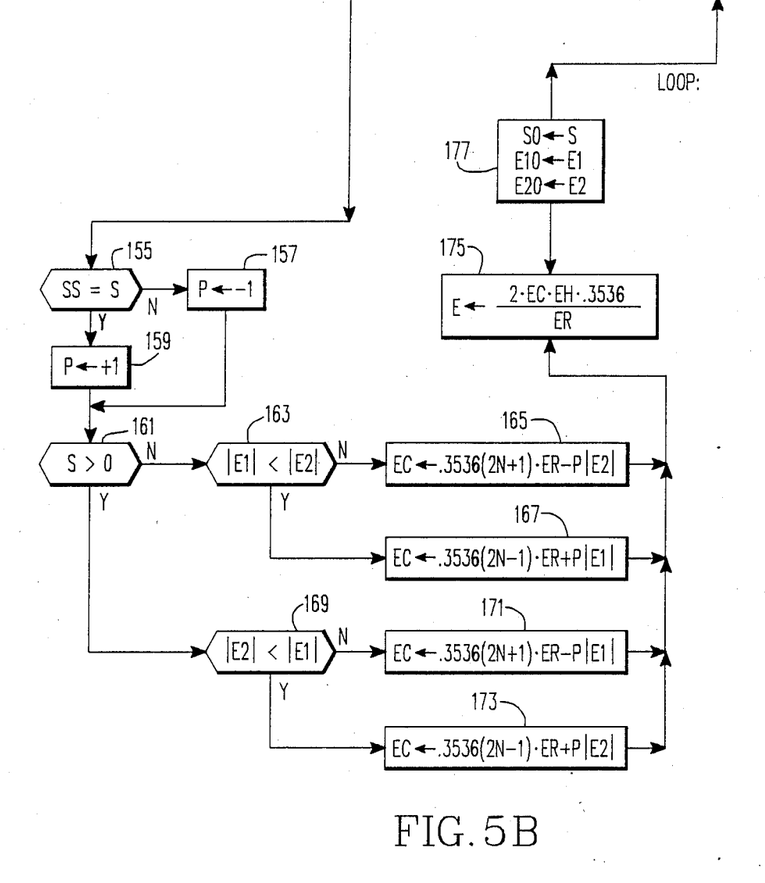

FIGS. 5a and 5b constitute a flow chart of the program employed by the digital computer 77 to reconstruct the voltage waveform sensed by the sensor from the quadrature electrical signals $e_1$ and $e_2$, in the manner discussed in connection in FIG. 4. As discussed previously, the analog quadrature signals $e_1$ and $e_2$ are applied to an analog to digital converter to generate digital samples of the instantaneous value of these waveforms for processing by the digital computer. The sampling rate should be sufficiently rapid that, at the maximum slew rate of the voltage signal being measured, which usually occurs at the its zero crossing, at least one data sample for $e_1$ or $e_2$ falls within he dead band. The sampling rate for the 60 hz voltage signal was 400 KHz in the exemplary system. As indicated at block 101 in FIG. 5a, the program waits for each new data sample. Two variables, $E_1$ and $E_2$, are set equal to the current instantaneous value of the quadrature signals $e_1$ and $e_2$ respectively at 103 when each new data sample is acquired. Another variable S which indicates whether the signs of the current values of $E_1$ and $E_2$ are the same is set, and that indication is saved as an additional variable SS in block 105.

A flag $Q_1$, which has a value of 1 if the preceding $E_1$ was inside the dead band defined by the lines 89-91 (entering) and 89'-91' (exiting) in FIG. 4, is checked block 107. If the preceding $E_1$ was inside the band and the present value of the first quadrature signal remains inside the band as determined in block 109 (using the larger boundary of lines 89'-91' equal to 0.24 ER), then the variable S, which will be recalled is an indication of whether the signs of $E_1$ and $E_2$ are the same, is set at 111 equal to S0 which is the value of S for the preceding data point.

If $E_1$ has emerged from the dead band, then the flag $Q_1$ is made equal to zero at 113 and it becomes necessary to determine whether the zero crossing count, n, should be indexed, and if so, in which direction. This is accomplished by setting another variable A at 115 to indicate whether the sign of the present $E_1$ is equal to the sign of $E_{100}$ which is the last value of $E_1$ before $E_1$ entered the dead band. For the purpose of this determination, the sign of $E_1$ is +1 if $E_1$ has a positive value, or −1 if it has a negative value so that A can have a value of −2, +2 or zero. If the signs of $E_1$ and $E_{100}$ are the same as determined in block 117, $E_1$ has emerged from the same side of the dead band at which it entered and hence there has been no zero crossing. If these signs are not the same, then $E_1$ has emerged from the opposite side of the dead band from which it entered and hence there was a zero crossing and n must be indexed. If the sign of A is the same as the sign of $E_2$ as determined in block 119 then the voltage is going up and a variable D is set equal to one at 121. If these sign are not equal, then the voltage is going down and D is set at equal to minus one at 123. The cumulative zero crossing count n is then indexed in the proper direction at block 125.

If it was determined back at block 107 that the preceding instantaneous value of $E_1$ was outside the dead band, then a check is made at 127 to determine if the present value of $E_1$ is within the dead band (using the narrower boundary defined by lines 89-91 in FIG. 4). If $E_1$ is now in the dead band, then the flag $Q_1$ is made equal to one, $E_{100}$ which is a variable equal to the last value of $E_1$ before the band was entered is made equal to $E_{10}$ which is the preceding value of $E_1$, and S which, it will be recalled, is an indication of whether the signs of $E_1$ and $E_2$ are the same is made equal to S0 which is the value of S for the last point, all as indicated at block 129. If $E_1$ remains outside of the dead band, then a determination is made at block 131 as to whether the preceding value of $E_2$ was outside the band. If it was, and the present value of $E_2$ is within the band as determined at block 133 (using the entering boundary lines 89-91 in FIG. 4), then a flag $Q_2$ is made equal to one, the last value of $E_2$ before it went into the band is saved, and S is made equal to S0 all in block 135. If it was determined in block 133 that $E_2$ was not within the band, then both $E_1$ and $E_2$ remain outside the dead band and the program proceeds to the calculation of the present value of the voltage signal in the manner discussed below.

If it was determined at 131 that $E_2$ was inside the band at the previous data point, a determination is made at block 137 whether it is still within the band. If it is, S is set equal to S0 in 139. If $E_2$ has now emerged from the band, then the flag $Q_2$ is set equal to zero at 141. A determination is then made in blocks 143 and 145 using the variable A in a manner similar to that described in connection with blocks 115 and 117, to determine whether the zero crossing count n should be indexed. If $E_2$ has emerged from the opposite side of the dead band from that from which it entered, then n is incremented or decremented in box 147, 149, 151 and 153 using the same technique as described in connection with emergence of $E_1$ from the dead band. That is, n is incremented if waveform $e_1$ leads $e_2$ and hence the voltage being measured is increasing, or n is decremented when the measured voltage is decreasing.

Turning to FIG. 5b, a determination is made in block 155 whether there has been a zero crossing by determining if SS, which is the saved sign, is equal to S, which was set equal to S for the preceding data point if either $E_1$ or $E_2$ is currently in the band. If there has been a zero crossing, a variable P is set equal to minus one at 157, otherwise P is set equal to plus one at 159.

If $E_1$ and $E_2$ are not of the same sign as determined in block 161 and $E_2$ is of smaller magnitude as determined in block 163, then a voltage EC is calculated using the cumulative zero crossing count n and the current magnitude $E_2$ in the equation in block 165. However, if $E_1$ and $E_2$ are not of the same sign but $E_1$ is smaller than $E_2$, then $E_1$ is used with n to calculate EC using the formula in block 167. When $E_1$ and $E_2$ are of the same sign, a determined at 161 and $E_1$ is smaller, as determined at 169, then $E_1$ is used with n to calculate the value of EC in block 171. On the other hand, if $E_2$ is the smaller of the two signals which are not of the same sign, then $E_2$ is used with n to calculate EC in block 173. As will be noticed, the first term in the equations for EC in blocks 165 through 171 determines the stairstep value from the cumulative count of zero crossings n, and the second term provides the interpolation based upon the magnitude of the selected quadrature signal.

The calculated voltage EC is then multiplied by a scaling factor in block 173 to determine the instantaneous magnitude, E, of the measured voltage.

It is convenient to chose $e_r$, the reference voltage used in the electronic circuits, equal to 2.828 volts, so that that the quantity $.3535 \times e_r = 1$ and $2 \times 3535/e_r = \frac{1}{4}$ and hence the computations in blocks 165, 167, 171, 173 and 175 are simplified.

The measured voltage is unambiguously determined by this procedure except for a constant error. This error is the result of the uncertainty of the initial value of n when the program is started. It is noted that n is an integer but otherwise arbitrary. If n can be set equal zero when the voltage is zero, then subsequent voltage measurements will be correct. In general this is not possible and one must adjust n in integer steps until the average value of the calculated voltage over one cycle is zero. After n is properly adjusted, the calculated voltages will be correct until the program is interrupted.

The program is completed by storing the present values of S, $E_1$ and $E_2$ as the last value in block 177 in preparation for the next computation of E. The program then loops back to the beginning and waits for the next input of data.

Figure 6:
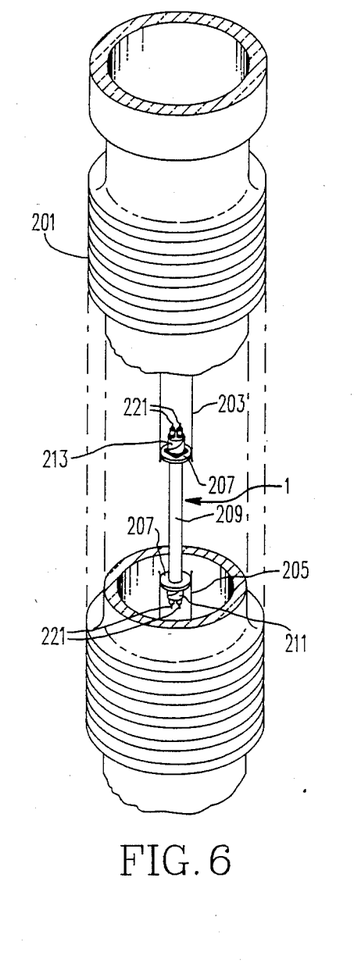
FIG. 6 is an isometric view with part broken away of apparatus for measuring line to ground voltages in a high voltage electric power transmission system in accordance with the invention.
Figure 7:
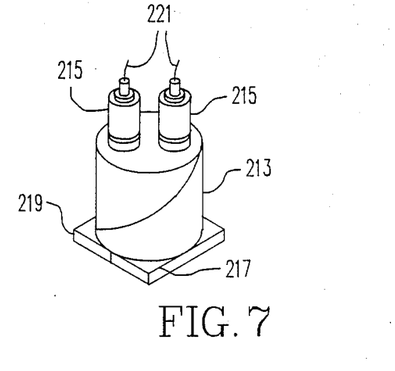
FIG. 7 is an enlargement of a subassembly of FIG. 6.
Figure 8:
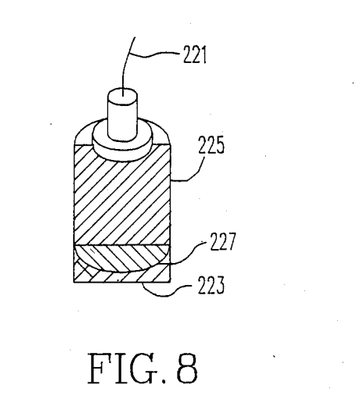
FIG. 8 a vertical section through a component which is part of the subassembly of FIG. 7.

FIGS. 6 through 8 illustrate a practical embodiment of a sensor 1, mounted in an insulation column 201 which is cut away to show the mounting of the sensor. An upper supporting tube 203 is connected to a transmission line (not shown) and a lower supporting tube 205 is connected to ground. Both tubes are electrically conducting and provide contact between the ends to the sensor 1 and the line and ground respectively through mounting discs 207 constructed from electrically conducting transparent material such as NESA glass. Crystal 209 and the polarizers 211 and 213 are made with a circular cross section rather than square as in FIG. 1 and 2 to reduce the electrical stresses.

As shown more clearly in FIG. 7 for the second polarizer 213, two cylindrical collimators 215 are mounted on one flat end face of the cylindrical polarizer and rectangular one-eighth wave plates 217 and 219 are mounted against the opposite end. The collimators 215, which focus the light beams received from the second polarizer 213 on the optic fiber cables 221, are shown broken away in FIG. 8. Each collimator 215 is formed from two pieces 223 and 225 of low refractive index glass, such as fused silica and one piece of high index glass 227 such as SF59. The radius of the curved surface of 227, the thickness of 227 and the length of 225 are chosen so that a bundle of parallel light entering 223 is focused on to the end of optic fiber 221 and the rays from the edge of the bundle strike the fiber. More particularly, these parameters a chosen so that the radius of the bundle of light divided by the focal length of the lens is equal to or greater than the numerical aperture of the fiber divided by the refractive index of the lower refractive index glass. The collimators at the other end of the sensor are similarly designed, but operate in the reverse direction to transform light received from the fiber optic cable into the bundle of parallel light which is passed through the first polarizer 211. This form of a collimator is necessary since in order to withstand the high electrical stresses during operation, and especially impulse tests, the insulator 201 is filled with oil or pressurized sulfur hexafluoride (SF6), and thus the optical system cannot have any glass air interfaces.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed:

1. Apparatus for measuring an electric potential between two spaced apart objects, said apparatus comprising:
   light source means generating collimated light;
   first polarizing means polarizing said collimated light to form polarized collimated light;
   an electro-optic crystal having a fourfold axis of rotary inversion extending between said spaced apart conducting objects, said polarized collimated light passing through said electro-optic crystal in a direction parallel to said fourfold axis of rotary inversion;
   fractional waveplate means through which at least a first portion of said polarized collimated light passes after passing through said crystal, said fractional waveplate means retarding said first portion of polarized collimated light about an odd multiple of $\frac{1}{4}$ wave with respect to the second portion of said polarized collimated light;
   second polarizing means through which said first and second portions of said polarized collimated light pass after passing through said crystal and said at least one portion thereof passes through the fractional waveplate means;
   first and second detectors converting said first and second portions of said polarized collimated light emerging from said second polarizing means into first and second electrical signals respectively; and
   output signal generating means for generating an output signal representative of the potential between said two spaced apart objects from said first and second electrical signals.

2. The apparatus of claim 1 wherein said light source means includes first and second collimated light sources generating first and second light beams which pass through said first polarizing means and said electro-optic crystal and form said first and second portions of polarized collimated light, said apparatus further including regulating means regulating said first and second collimated light sources to maintain the peak magnitude of said first and second electrical signals substantially constant and equal to each other.

3. The apparatus of claim 2 wherein said regulating means comprises:
   a reference voltage source generating a reference voltage, and
   first and second regulating circuits associated with the first and second light sources and detectors respectively and each comprising:
   a peak voltage detector generating an associated peak voltage signal representative of the peak magnitude of the electrical signal generated by an associated detector, and
   a feedback circuit responsive to the associated peak voltage signal and the reference voltage regulating the intensity of the light beam generated by the associated light source to maintain the associated peak voltage signal equal to the reference voltage.

4. The apparatus of claim 1 wherein said output signal generating means comprises means to generate said output signal from selected segments of said first and second electrical signals.

5. The apparatus of claim 2 wherein said output signal generating means comprises:
   means detecting the sequence of zero crossings of said first and second electrical signals and generating a bidirectional cumulative count of said zero crossings which changes counting direction when one of said first and second electrical signals generates two zero crossings in succession, and
   means utilizing said cumulative count to generate said output signal.

6. The apparatus of claim 5 including means freezing the bidirectional cumulative count of zero crossings when the instantaneous magnitude of either of said first and second electrical signals falls within a band representative of a magnitude less than a preselected value, and means responsive to either of said first and second electrical signals exiting said band to unfreeze said cumulative count and in response thereto to index the cumulative count but only if the electrical signal which exits the band exits with a polarity which is opposite the polarity of that electrical signal when it entered the band.

7. The apparatus of claim 5 wherein said means utilizing the cumulative count to generate said output signal includes means to adjust the amplitude of said output signal generated from said cumulative count by the instantaneous magnitude of a selected one of said first and second electrical signals.

8. The apparatus of claim 7 wherein said means to adjust the amplitude of the output signal by the instantaneous magnitude of a selected one of the first and second electrical signals select the electrical signal with the smaller instantaneous magnitude.

9. The apparatus of claim 8 wherein said means to adjust the output signal by the instantaneous magnitude of the electrical signal of smaller instantaneous magnitude includes means to adjust the output signal by the magnitude of the electrical signal of smaller instantaneous magnitude in a sense determined from the relative polarities of the first and second electrical signals.

10. The apparatus of claim 1 where said fractional waveplate means comprise first and second one-eighth waveplates through which said first and second light beams respectively pass, said first and second one-eighth waveplates having axes which are oriented about 90 degrees with respect to one another.

11. A method of measuring electrical voltage between two spaced objects comprising the steps of:
    positioning an electro-optic crystal exhibiting birefringence in two orthogonal axes transverse to an optical axis in response to an electric field, with said optical axis extending between said two objects;
    generating collimated light polarized with a selected plane of polarization;
    passing the polarized collimated light through said crystal parallel to the optical axis and with the plane of polarization of the polarized collimated light at a selected angle to said two orthogonal axes of the crystal;
    retarding a first portion of said polarized collimated light emerging from said crystal with respect to a second portion;
    passing the two portions of polarized collimated light after the first has been retarded relative to the second through polarizing means;
    converting the two portions of said polarized collimated light as they emerge from the polarizing mean into first and second phase shifted electrical signals; and
    generating an output signal representative of the voltage between said two spaced objects from said two phase shifted electrical signals.

12. The method of claim 11 wherein the step of retarding a first portion of said polarized collimated light comprises retarding said first portion about $\frac{1}{4}$ wave with respect to the second portion.

13. The method of claim 12 wherein the step of generating said polarized collimated light comprises generating first and second polarized collimated light beams which are passed through said crystal and form the first and second portions of polarized collimated light, said method including regulating the intensity of said two light beams to maintain the peak magnitudes of the two electrical signals constant and equal to one another.

14. The method of claim 13 wherein the step of generating an output signal from said two phase shifted electrical signals comprises:
    monitoring the sequence of zero crossings of said two phase-shifted electrical signals; maintaining a bidirectional cumulative zero crossing count of the zero crossings of said two phase-shifted electrical signals,
    changing the direction of said bidirectional cumulative zero crossing count in response to two successive zero crossings by either of said two electrical signals, and
    generating a stairstep output signal representative of the measured electrical voltage between said two spaced objects from said bidirectional cumulative zero crossing count.

15. The method of claim 14 including:
    adjusting the magnitude of the output signal generated from said bidirectional cumulative zero crossing count by the instantaneous magnitude of a selected one of said two phase shifted electrical signals.

16. The method of claim 15 wherein the magnitude of the output signal generated from said bidirectional cumulative zero crossing count is adjusted by the instantaneous magnitude of the phase-shifted signal which is smaller in magnitude at that instant.

17. The method of claim 16 wherein said step of adjusting the magnitude of the output signal generated from said bidirectional cumulative zero crossing count by the magnitude of the phase shifted electrical signal of smaller magnitude includes making such adjustment in a sense determined from the relative polarities of the two phase shifted electrical signals.

18. The method of claim 17 including:
freezing said bidirectional cumulative zero crossing count when the instantaneous magnitude of either of said two phase shifted electrical signals falls within a band representative of a magnitude less than a preselected value, and unfreezing said bidirectional cumulative zero crossing count in response to either of said two electrical signals exiting said band and indexing the bidirectional cumulative zero crossing count in response thereto but only when the electrical signal which exists the band, exits with a polarity which is opposite to the polarity of that electrical signal when it entered the band.

* * * * *